US006483922B1

(12) United States Patent
Limacher

(10) Patent No.: US 6,483,922 B1
(45) Date of Patent: Nov. 19, 2002

(54) METHOD AND SYSTEM FOR GENERATING A SIMULATED REVERBERATION AUDIO SIGNAL

(75) Inventor: Olivier Limacher, Allentown, PA (US)

(73) Assignee: Allen Organ Company, Macungie, PA (US)

( * ) Notice: Subject to any disclaimer, the term of this patent is extended or adjusted under 35 U.S.C. 154(b) by 0 days.

(21) Appl. No.: 09/058,917

(22) Filed: Apr. 13, 1998

(51) Int. Cl.[7] .............................. H03G 3/00; G10H 1/02

(52) U.S. Cl. .............................. 381/63; 381/61; 84/629; 84/630; 84/DIG. 26

(58) Field of Search ........................ 381/63, 61; 84/629, 84/630, DIG. 26

(56) References Cited

U.S. PATENT DOCUMENTS 4,472,993 A 9/1984 Futamase et al. ............ 84/1.24
5,272,274 A 12/1993 Kimura ........................ 84/658
5,498,835 A 3/1996 Ichiki .......................... 84/630
5,553,150 A * 9/1996 Kozuki ........................ 381/61
5,555,306 A 9/1996 Gerzon ........................ 381/63
5,652,797 A * 7/1997 Okamura et al. ........... 381/118
5,689,571 A 11/1997 Kitamura ..................... 381/63
6,091,012 A * 7/2000 Takahashi .................... 84/626

* cited by examiner

*Primary Examiner*—Forester W. Isen
*Assistant Examiner*—Laura A. Grier
(74) *Attorney, Agent, or Firm*—Drinker Biddle & Reath LLP

(57) ABSTRACT

A method and apparatus for generating a simulated reverberation characteristic in an input audio signal having a plurality of channels, each channel transmitting time-synchronized data elements. The method and apparatus imparts a unique delay to each element of a set of time-synchronized data elements and thereafter delays the data element set through a series of delay elements. Each of a plurality of early reflection taps reads in and outputs a unique linear combination of the delayed data elements. The delayed elements are selectively input to at least one summing filter incorporating a plurality of comb filters. The output of the at least one summing filter is selectively combined based upon a summing scheme to provide a plurality of sum output elements. The sum output elements are combined with the early reflection tap output and a preselected combination of the time-synchronized data elements of the input signal to create a simulated reverberation signal.

28 Claims, 11 Drawing Sheets input
Where w = channel number

| DFPI | A | B | C | D | E | F | G | H |
|---|---|---|---|---|---|---|---|---|
| X | | | | | | | | |
| 1 | 1 | 2 | 3 | 4 | 5 | 6 | 7 | 8 |
| 2 | 5 | 2 | 3 | 4 | 1 | 6 | 7 | 8 |
| 3 | 6 | 2 | 3 | 4 | 1 | 5 | 7 | 8 |
| 4 | 7 | 2 | 3 | 4 | 1 | 5 | 6 | 8 |
| 5 | 8 | 2 | 3 | 4 | 1 | 5 | 6 | 7 |
| 6 | 8 | 1 | 3 | 4 | 2 | 5 | 6 | 7 |
| 7 | 8 | 5 | 3 | 4 | 2 | 1 | 6 | 7 |
| 8 | 8 | 6 | 3 | 4 | 2 | 1 | 5 | 7 |
| 9 | 8 | 7 | 3 | 4 | 2 | 1 | 5 | 6 |
| 10 | 8 | 7 | 2 | 4 | 3 | 1 | 5 | 6 |
| 11 | 8 | 7 | 1 | 4 | 3 | 2 | 5 | 6 |
| 12 | 8 | 7 | 5 | 4 | 3 | 2 | 1 | 6 |
| 13 | 8 | 7 | 6 | 4 | 3 | 2 | 1 | 5 |
| 14 | 3 | 7 | 6 | 4 | 8 | 2 | 1 | 5 |
| 15 | 2 | 7 | 6 | 4 | 8 | 3 | 1 | 5 |
| 16 | 1 | 7 | 6 | 4 | 8 | 3 | 2 | 5 |
| 17 | 5 | 7 | 6 | 4 | 8 | 3 | 2 | 1 |
| 18 | 5 | 8 | 6 | 4 | 7 | 3 | 2 | 1 |
| 19 | 5 | 3 | 6 | 4 | 7 | 8 | 2 | 1 |
| 20 | 5 | 2 | 6 | 4 | 7 | 8 | 3 | 1 |
| 21 | 5 | 1 | 6 | 4 | 7 | 8 | 3 | 2 |
| 22 | 5 | 1 | 7 | 4 | 6 | 8 | 3 | 2 |
| 23 | 5 | 1 | 8 | 4 | 6 | 7 | 3 | 2 |
| 24 | 5 | 1 | 3 | 4 | 6 | 7 | 8 | 2 |
| 25 | 5 | 1 | 2 | 4 | 6 | 7 | 8 | 3 |
| 26 | 6 | 1 | 2 | 4 | 5 | 7 | 8 | 3 |
| 27 | 7 | 1 | 2 | 4 | 5 | 6 | 8 | 3 |
| 28 | 8 | 1 | 2 | 4 | 5 | 6 | 7 | 3 |
| 29 | 8 | 1 | 6 | 4 | 5 | 2 | 7 | 3 |
| 30 | 3 | 1 | 6 | 4 | 5 | 2 | 7 | 8 |
| 31 | 3 | 1 | 7 | 4 | 5 | 2 | 6 | 8 |
| 32 | 3 | 5 | 7 | 4 | 1 | 2 | 6 | 8 |
| 33 | 2 | 5 | 7 | 4 | 1 | 3 | 6 | 8 |
| 34 | 2 | 5 | 8 | 4 | 1 | 3 | 6 | 7 |
| 35 | 2 | 6 | 8 | 4 | 1 | 3 | 5 | 7 |

FIG. 9

| | | | | | | | | |
|---|---|---|---|---|---|---|---|---|
| 15 | 2 | 7 | 6 | 4 | 8 | 3 | 1 | 5 |
| 16 | 1 | 7 | 6 | 4 | 8 | 3 | 2 | 5 |

| | | | | | | | | |
|---|---|---|---|---|---|---|---|---|
| 16 | 1 | 7 | 6 | 4 | 8 | 3 | 2 | 5 |
| 17 | 5 | 7 | 6 | 4 | 8 | 3 | 2 | 1 |

| | | | | | | | | |
|---|---|---|---|---|---|---|---|---|
| 17 | 5 | 7 | 6 | 4 | 8 | 3 | 2 | 1 |
| 18 | 5 | 8 | 6 | 4 | 7 | 3 | 2 | 1 |

FIG. 10

Where z = number of elements / channel in FIG. 14

| | | | | | | | | | | | | | | | | | | | | | |
|---|---|---|---|---|---|---|---|---|---|---|---|---|---|---|---|---|---|---|---|---|---|
| | - | + | + | S | S | S | + | - | + | + | S | S | S | + | - | + | + | S | S | S | + |
| 1 | 1 | 2 | 3 | 4 | 5 | 6 | 7 | 8 | 9 | 10 | 11 | 12 | 13 | 14 | 15 | 16 | 17 | 18 | 19 | 20 | 21 |
| 2 | 22 | 23 | 24 | 25 | 26 | 27 | 1 | 2 | 3 | 4 | 5 | 6 | 7 | 8 | 9 | 10 | 11 | 12 | 13 | 14 | 15 |
| 3 | 16 | 17 | 18 | 19 | 20 | 21 | 22 | 23 | 24 | 25 | 26 | 27 | 1 | 2 | 3 | 4 | 5 | 6 | 7 | 8 | 9 |
| 4 | 10 | 11 | 12 | 13 | 14 | 15 | 16 | 17 | 18 | 19 | 20 | 21 | 22 | 23 | 24 | 25 | 26 | 27 | 1 | 2 | 3 |
| 5 | 4 | 5 | 6 | 7 | 8 | 9 | 10 | 11 | 12 | 13 | 14 | 15 | 16 | 17 | 18 | 19 | 20 | 21 | 22 | 23 | 24 |
| 6 | 25 | 26 | 27 | 1 | 2 | 3 | 4 | 5 | 6 | 7 | 8 | 9 | 10 | 11 | 12 | 13 | 14 | 15 | 16 | 17 | 18 |
| 7 | 19 | 20 | 21 | 22 | 23 | 24 | 25 | 26 | 27 | 1 | 2 | 3 | 4 | 5 | 6 | 7 | 8 | 9 | 10 | 17 | 18 |
| 8 | 13 | 14 | 15 | 16 | 17 | 18 | 19 | 20 | 22 | 23 | 24 | 25 | 26 | 27 | 1 | 2 | 3 | 4 | 5 | 6 | 7 |

Channels (rows 1–8); DFPs (columns)

FIG. 13

| PPP W \ Z | 1 | 2 | 3 | | | | 4 | 5 | 6 | 7 | | | | 8 | 9 | 10 | 11 | | | | 12 |
|---|---|---|---|---|---|---|---|---|---|---|---|---|---|---|---|---|---|---|---|---|---|
| 1 | 1 | 2 | 3 | | | | 7 | 8 | 9 | 10 | | | | 14 | 15 | 16 | 17 | | | | 21 |
| 2 | 22 | 23 | 24 | | | | 1 | 2 | 3 | 4 | | | | 8 | 9 | 10 | 11 | | | | 15 |
| 3 | 16 | 17 | 18 | | | | 22 | 23 | 24 | 25 | | | | 2 | 3 | 4 | 5 | | | | 9 |
| 4 | 10 | 11 | 12 | | | | 16 | 17 | 18 | 19 | | | | 23 | 24 | 25 | 26 | | | | 3 |
| 5 | 4 | 5 | 6 | | | | 10 | 11 | 12 | 13 | | | | 17 | 18 | 19 | 20 | | | | 24 |
| 6 | 25 | 26 | 27 | | | | 4 | 5 | 6 | 7 | | | | 11 | 12 | 13 | 14 | | | | 18 |
| 7 | 19 | 20 | 20 | | | | 25 | 26 | 27 | 28 | | | | 5 | 6 | 7 | 8 | | | | 12 |
| 8 | 13 | 14 | 15 | | | | 19 | 20 | 21 | 22 | | | | 26 | 27 | 28 | 29 | | | | 6 |

FIG. 14

METHOD AND SYSTEM FOR GENERATING A SIMULATED REVERBERATION AUDIO SIGNAL

FIELD OF THE INVENTION

The present invention is directed to systems for simulating acoustical characteristics such as reverberation. More specifically, the present invention is directed to a system for generating a simulated reverberation signal in electronic musical instruments.

BACKGROUND OF THE INVENTION

In a natural acoustic environment, for example, a concert hall where a group of listeners may be enjoying a large symphony orchestra or an organ performance, each listener in the auditorium is having a unique experience as a result of his or her location in the hall. Those located near the source of the sound are aware of that closeness due to the presence of sound that is localized in some area of the room. Conversely, those at a greater distance may be less able to focus on the sound but rather feel that it is spread over a wider area. However, all in the hall will experience the spaciousness of the room as the sounds are subtly blurred by the many and various paths taken by the sound from its source to the listener's ear. Further, when all the sounds cease to emanate from the source, that which is heard as the remaining energy gradually dies away revealing a degree of spaciousness.

There has been much work done in trying to electronically synthesize the reverberation characteristics of notable concert halls in an attempt to impart those qualities to instruments found in smaller quarters. Much of the pioneering effort on this subject was done by M. R. Schroeder, as documented in a paper published in the Journal Of The Audio Engineering Society, July 1962. At the time of that publication the essential resources to accomplish this task were not available to the extent required to produce a convincing result, at least by today's standards. Over the intervening years, integrated circuits, particularly memory devices and signal processors, have become increasingly more available and capable of operating at ever greater speeds. These developments have contributed to overcoming many of the deficiencies of prior reverberation systems.

Various reverberation systems have been disclosed in several U.S. patents. These include U.S. Pat. No. 5,498,835 to Ichiki which discloses a digital signal processing apparatus including a reverberation effecting circuit. As illustrated in FIG. 5 of that patent, an input signal $TC_7$ is fed to an initial reflecting tone generator section 60 in the reverberation effecting circuit. The initial tone generator produces an initial reflection tone $TC_1$ and $TC_2$ which serves as a portion of the total reverberation characteristic. The reflection tone is obtained by first inputting the initial sound into several delay elements $DM_1$. An output signal $DC_2$–$DC_9$ is then read from the delay elements $DM_1$ and fed to a plurality of multipliers $KC_5$–$KC_{12}$. The output of the multipliers is summed to provide the initial reflection tone $TC_1$ and $TC_2$. Another output $DC_{10}$ from the initial tone generator 60 represents the initial input signal $TC_7$ delayed by the delay elements $DM_1$. This signal $DC_{10}$ is then fed to the reverberating tone generator 61. The reverberating tone generator generates a final reverberation tone $TC_3$ and $TC_4$ which forms another portion of the reverberation characteristic. This is achieved by splitting the input signal to the reverberation generator and feeding the split signals $TC_5$ and $TC_6$ to two parallel comb filters $DM_2$ and $DM_3$. The summed output of the comb filters provides the output for the reverberation tone generator $TC_3$ and $TC_4$. The original input signal left and right, the initial reflecting tone generator output $TC_1$ and $TC_2$, and the reverberation tone generator output $TC_3$ and $TC_4$ are summed to provide Left Output and Right Output signals with the reverberation characteristic. However, in this system the left and right audio signals are combined in a straightforward manner. This system does not take into account the potential for audio signals which will cancel each other out.

U.S. Pat. No. 5,272,274 to Kimura discloses an apparatus for imparting reverberation to an input sound including a series of shift register delay elements, multipliers, and adders in a feedback loop. The shift registers provide variable delay periods. The reverberation time period, tone volume, frequency characteristic, and density are controlled by the multiplier coefficients and the number of stages in each shift register. This system also fails to take into consideration that different input signals with the same or similar frequencies which will result in a cancellation effect at the adder which sums the input signals.

U.S. Pat. No. 5,689,571 to Kitamura discloses a device for producing reverberation wherein two early reflection sounds and a reverberation sound are generated from an original sound to produce a full reverberation sound. The early reflection sound and the reverberation sound are produced using separate digital signal processors. The device can therefore process the sounds in different modes without any limitation in time.

U.S. Pat. No. 5,555,306 to Gerzon discloses a signal processing system which produces a distance effect for a source signal. The system inputs the source signal to a sequence of delays and early reflection simulators. The output of the delays and the simulators are summed to provide an enhanced signal.

These systems fail to adequately take into consideration the likelihood that multi-channel audio signals will include multiple tones which have the same or similar frequencies. Without addressing this situation, the output signal will fail to incorporate the fullness of the input signal.

SUMMARY OF THE INVENTION

The present invention provides a method and apparatus for generating a simulated reverberation signal having a plurality of output channels.

The method of the present invention for generating a simulated reverberation signal having a plurality of output channels comprises receiving an audio input signal having a plurality of channels wherein each channel transmits time-synchronized audio data elements representative of the audio sound upon which one wishes to impart the reverberation. The synchronized data elements from the plurality of channels form a data element set. Each data element is given a unique delay. The data elements, each having a unique delay are then passed through a series of several delay elements, repeatedly delaying the data element set. During the delay of the data element set a plurality of early reflection taps are associated with the data element set. Each of the taps comprises a plurality of latch elements equal in number to the number of output channels. Each of the taps is coupled to a distinct linear combination of the data elements at distinct delay periods. Thereafter, the distinct linear combination of the data elements is read into the respective tap. Each tap then outputs a tap output set comprising the distinct linear combination of the data elements.

Thereafter, a uniquely ordered combination of the repeatedly delayed data element set is input to each one of a plurality of summing filters. Each uniquely ordered combination of the repeatedly delayed data element set comprises a plurality of complementary subsets. Within each summing filter each one of the complementary subsets is input into one of a plurality of individual filters. The outputs of the plurality of individual filters of each summing filter are combined and this combination is output from the summing filter.

The simulated reverberation signal is generated having a plurality of output channels. Each output channel comprises a predetermined summation of the outputs of the summing filters, the tap output set element of each of the plurality of taps which corresponds to the output channel and a preselected combination of the time-synchronized data elements of the audio input signal.

The system for generating a simulated reverberation signal having a plurality of output channels comprises a preprocessor stage, a diffused field processor stage and a post processor stage. The preprocessor stage receives the audio input signal and comprises a channel assignment module (CAM), a series of a plurality of memory elements connected to the CAM, and a plurality of early reflection taps. As described above, the audio input signal comprises a plurality of time-synchronized audio data elements forming a data element set. The CAM receives the audio signal and imparts a unique delay to each element of the set of synchronized data elements. The plurality of memory elements includes a first memory element which receives the set of data elements output by the CAM. The data element set is passed from memory element to memory element, each memory element imparting a delay to the data element set. Each early reflection tap has a plurality of latch elements equal to the number of output channels. Each tap is coupled to the series of memory elements at a unique delay period such that the plurality of latch elements of each tap align with a unique linear combination of data elements and each tap reads in the unique linear combination of data elements and outputs a tap data output set comprising the unique linear combination of data elements.

The diffused field processor stage receives the set of delayed data elements and comprises a first processor or generator, a memory element connected to the processor/generator, and a plurality of summing filters connected to the processor/generator. The processor/generator receives the delayed data element set. The processor/generator generates a set of individually unique combinations of the delayed data elements. Each unique combination comprises a plurality of complementary subsets. Each of the summing filters includes a plurality of individual filters equal in number to the plurality of complementary subsets. For each summing filter, the outputs of the individual filters are summed and output from the summing filter. The processor/generator transfers to each of the summing filters a distinct one of the elements of the combinations set and therein each of the complementary subsets is input to a distinct individual filter. The output of each summing filter is output from the processor stage.

The post processor stage receives the output of each summing filter, tap data set of each tap, and a preselected combination of the time-synchronized data elements of the audio input signal and comprises a processor/combiner and a plurality of adders connected to the processor/combiner. The processor/combiner receives the output of each summing filter, the tap data set of each tap, and the preselected combination of the time-synchronized data elements. The processor/combiner, combines the outputs of the summing filter into a sum output set, wherein the number of elements of the sum output set is equal to the number of output channels. For each of the output channels, the processor/combiner transfers to one of the adders a distinct element of the sum output set, the tap data set element of each of the plurality of taps which corresponds to the particular output channel, and a preselected combination of the time-synchronized data elements. Each adder then adds the received elements and provides an output corresponding to the particular output channel. The output of the plurality of adders is the simulated reverberation signal.

BRIEF DESCRIPTION OF THE DRAWINGS

FIG. 9 is an example of a table of unique combinations of outputs from the preprocessor of FIG. 1 generated by and used with the present invention.

FIG. 10 is a table of select elements of the table of FIG. 7.

FIG. 13 is an example of a table of outputs from the diffused field processor of FIG. 1 generated by and used with the present invention.

FIG. 14 is a table of selected elements from the table illustrated in FIG. 13.

DETAILED DESCRIPTION OF THE PRESENT INVENTION

The present invention will be described in conjunction with the accompanying figures, wherein like numerals identify like elements.

Figure 1:
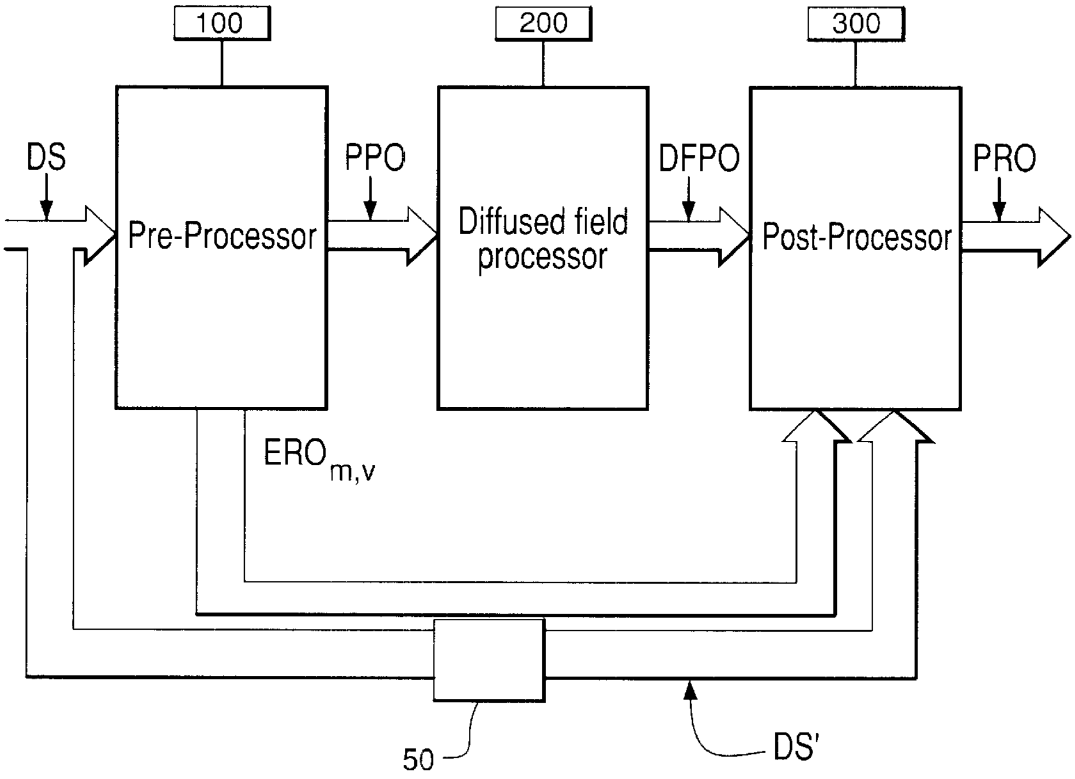
FIG. 1 is a block diagram illustrating the present invention.

As illustrated in FIG. 1, the present invention comprises three primary elements or stages: a preprocessor 100, a diffused field processor 200, and a post processor 300. The preprocessor 100 receives an original audio input signal DS which comprises a plurality of channels. Each of the channels transmits time-synchronized data elements. Each channel may be connected to a distinct musical instrument, for example, an electronic organ, a guitar, an electric piano, etc., or to a microphone. The input signal DS is also fed to an input signal processor 50 which in turn feeds a processed input signal DS' to the post processor 300. The preprocessor 100 provides an output PPO which is fed to the diffused field processor 200. The preprocessor 100 also provides an output $ERO_{m,v}$ from a plurality of early reflection taps which is also input to the post processor 300. The diffused field processor 200 provides an output DFPO which is input to the post processor 300. The post processor 300 outputs an audio output signal PRO comprising a plurality of output channels. The audio output signal PRO has a simulated reverberation characteristic imparted to it.

EXAMPLE 1

Figure 2:
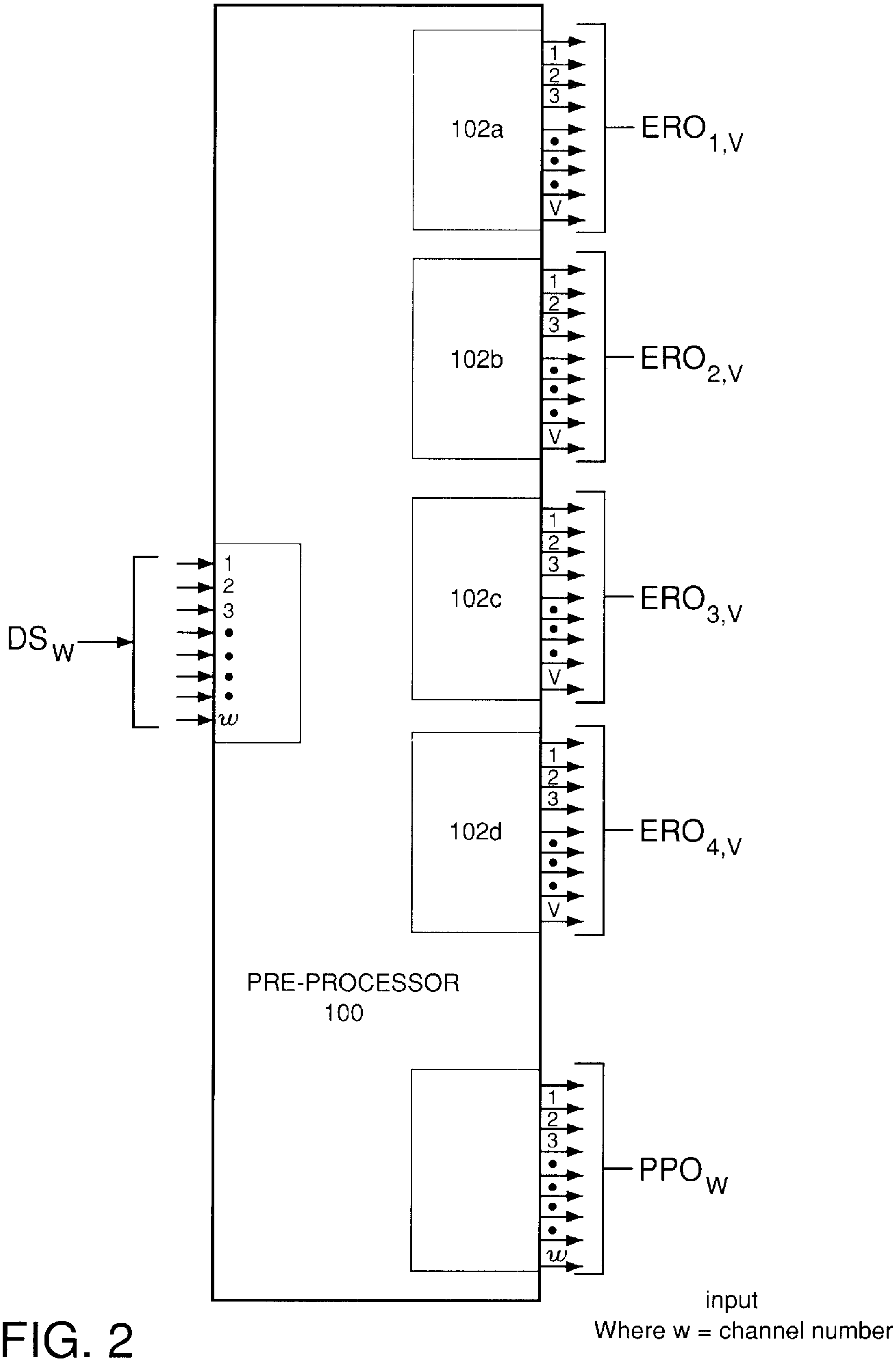
FIG. 2 is a simplified block diagram illustrating the preprocessor of FIG. 1.

As illustrated in FIG. 2, the preprocessor 100 receives the original audio input signal DS. The input signal DS may comprise any number of channels greater than two. In this example, the input signal DS comprises eight channels as illustrated by the arrows bracketed by the reference characters $DS_w$. In this example w represents the total number of channels in the input signal DS. The use of eight channels is meant only to assist in describing the present invention and is not meant to limit its scope. The input signal DS comprises digitized and time-synchronized audio information on each of the w channels. As illustrated in FIG. 2, the preprocessor 100 includes a plurality of early reflection taps 102*a*–102*d*. In this example, as illustrated in FIG. 2, the preprocessor 100 has four early reflection taps. The number of early reflection taps is meant only to be illustrative and not limit the scope of the present invention. The number of early reflection taps is limited only by individual design choice, hardware limitations, and economic considerations. Each early reflection tap 102*a*–102*d* provides an output signal $ERO_{m,v}$ wherein m is the particular early reflection tap and v is the particular element of the early reflection tap signal ERO. In this example, each early reflection tap 102*a*–102*d* comprises eight latches (so that v=8). As described below, the number of tap latches and therefore tap outputs, corresponds to the number of output channels.

As will be discussed further below, this example describes a system wherein each reflection tap 102 has the same number of latches as channels in the input signal DS, the particular element of the tap output signal $ERO_{m,v}$(as indicated by the variable v) of a particular early reflection tap 102 (as indicated by the variable m) does not necessarily correspond to the input channel (as indicated by the variable w) of the input signal DS. More particularly, the number of outputs v of the early reflection taps 102*a*–102*d* corresponds to the number of output channels q in the audio output signal PRO. In this example, as discussed below with respect to FIGS. 2 and 11–14, the number of output channels equals the number of input channels. However, the number of output channels may be greater or fewer than the number of input channels. This is discussed in more detail below. The preprocessor 100 outputs a signal PPO. The output signal PPO comprises a plurality of elements that may also be described by the variable w since the number of elements in the preprocessor output signal PPO is equal to the number of elements in the input signal DS.

Figure 3:
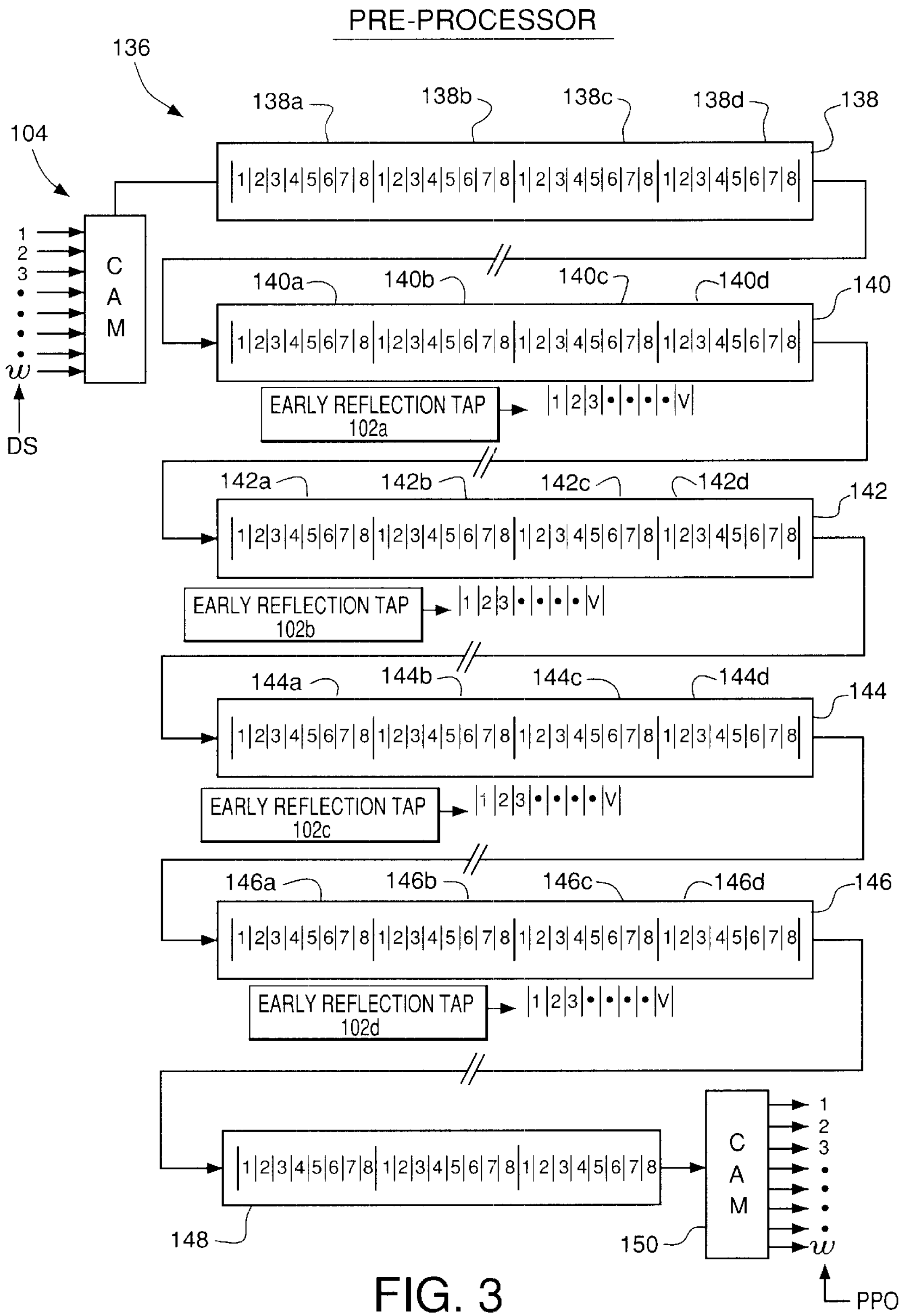
FIG. 3 is a detailed block diagram of the preprocessor of FIG. 1.

An embodiment of the preprocessor 100 is illustrated in greater detail in FIG. 3. Upon receipt of the input signal DS, the preprocessor 100 directs the input signal DS to a channel assignment module 104. The channel assignment module 104 serves to time-division-multiplex a set of time-synchronized audio data elements wherein data element represents channel information for the respective channel. In the embodiment illustrated in FIG. 3, the input signal DS is received in a parallel format and may thereafter be converted to a serial format by the channel assignment module 104. Alternatively, the input signal DS may be received in serial format and converted to a parallel format or left in serial format, and a parallel signal may be left in the parallel format. The channel assignment module 104 imparts a unique delay to each of the time-synchronized data elements with respect to each other. The delay imparted by the channel assignment module 104 reduces the likelihood that phase cancellation will occur between the data elements when two or more of the data elements have the same, or close to the same, frequency. By keeping as much channel-to-channel independence as possible a more natural acoustic simulation can be achieved.

Figure 4:
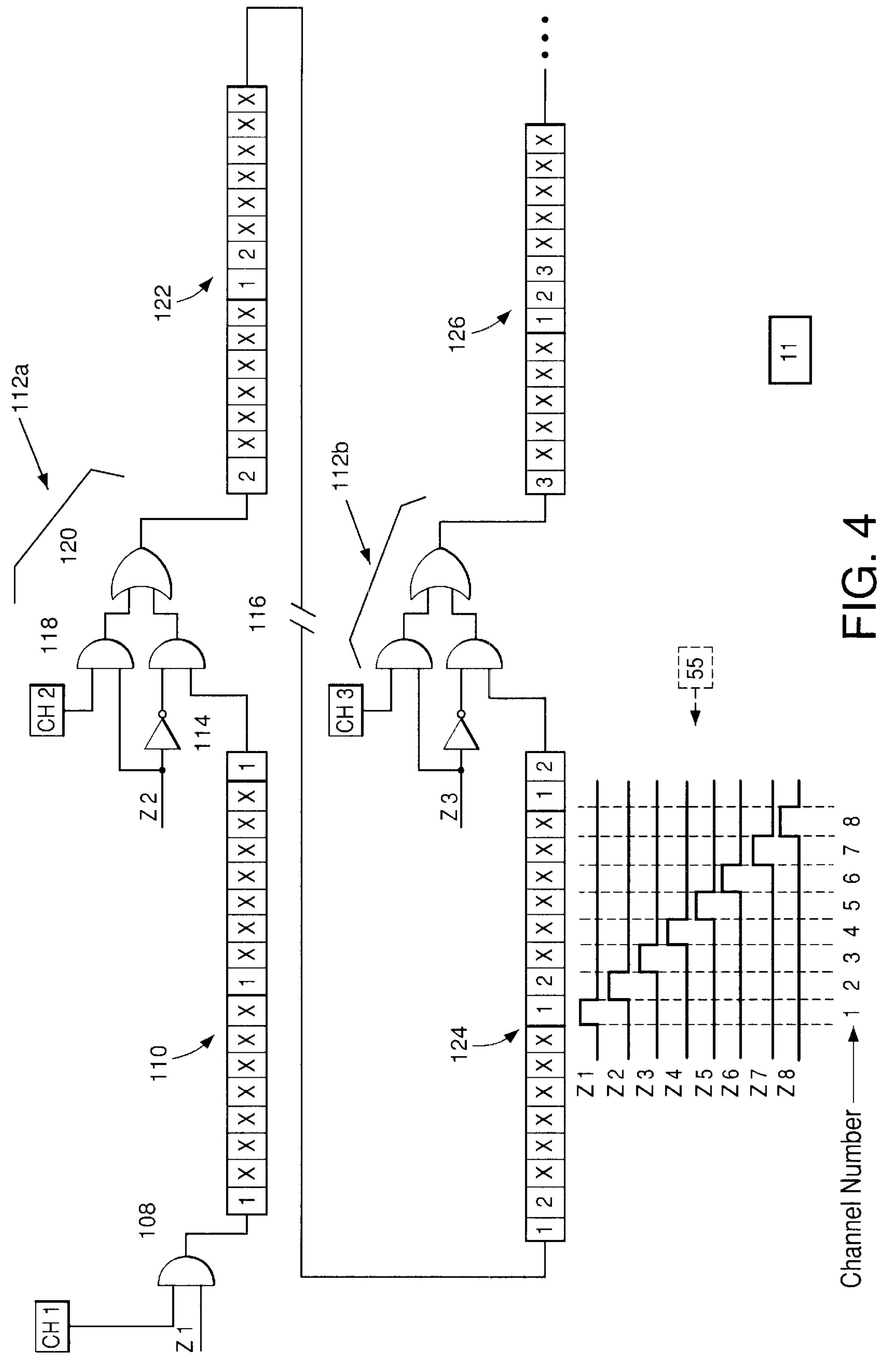
FIG. 4 is a partial circuit diagram illustrating the channel assignment module of FIG. 3.

An embodiment of the channel assignment module 104 is illustrated in FIG. 4. The channel assignment module 104 comprises a plurality of shift registers or other memory devices 110, 122, 124, 126 and various circuit elements for imparting the unique delay to each data element of input signal DS. In this embodiment, the channel assignment module 104 also converts the parallel input signal DS to a serial signal. The shift registers 110, 122, 124, 126 are single bit shift registers. In other words, the bits shift in the registers one position at a time.

The channel assignment module 104 is governed by a plurality of control signals Z1–Z8 (one for each channel of the input signal DS). Each control signal is fed to a particular circuit combination for imparting delay to a particular data element. The first audio data information element (channel 1) is input to an AND gate 108 which also receives the control signal Z1. When the control signal Z1 is HIGH, the information on channel 1 will be input to the shift register section 110. Since all of the other control signals Z2–Z8 are low, no other information will be input to the shift register element 110. Information for channels 2 and 3 of the audio signal DS are inserted into the appropriate shift register segments by switching circuit 112. The switching circuit 112 for channel 2 is inserted between location 1 and 2 in the register train. Unlike the switching circuit 108 for channel 1, the switch input for the remaining channels must allow prior channel information to pass through and thus requires additional circuit elements. In the example of FIG. 4, the additional circuitry comprises an inverter 114, a pair of AND gates 116, 118 and an OR gate 120. The channel 2 data element and the control signal Z2 are applied to the switching circuit 112*a* in order to insert the channel 2 data element into the shift register having a unique delay. Control signal Z2 is HIGH only at the instance which corresponds with the particular shift register element which is to receive the channel 2 data element to place the channel 2 data element and only the channel 2 data element into the string in the appropriate position. Since the shift registers 110, 122, 124, 126 are single bit shift registers, this insures that the next shift register element will not receive the channel 2 data element and will retain the channel 1 data element. The remaining data elements are input to the corresponding shift registers in a similar manner. If the control signal corresponding to a particular channel was not LOW when the other data elements passed through the switching circuit, then the other data element would be replaced by the particular data element. This is a function of the single bit shift nature of the registers.

In the example illustrated in FIGS. 3 and 4, where the input signal DS has eight channels, a total of seven switching circuits identical to switching circuit 112 will be required to input all eight channels of data into the serial data element set. The number of switching circuits 112 required for this particular example is one less than the number of input signal channels. As discussed above, the number of input signal channels may vary and is not limited to eight. If all the channels of the input signal DS were active, the output of the channel assignment module 104 would be a continuous stream of data representing all channels of the input signal DS wherein the earlier channels would be delayed more than the later ones. The delay scheme illustrated in FIG. 4 is merely an example of how the input signal DS may be delayed by the channel assignment module 104. Various alternative delay schemes may be used which may impart various delays to the audio input signal DS. The output of the channel assignment module 104 is a data element set comprising the original input signal DS wherein each element of the original input signal DS has been imparted with a unique delay.

Referring again to FIG. 3, the data element set is then input to a shift register 136. The shift register 136 comprises a plurality of delay segments 138, 140, 142, 144, and 146 in series. Each delay segment has the capacity to store multiple iterations of the data element set. Each delay segment may be connected to the following delay segment by additional shift register elements implied by the broken line connecting the delay element segments. The number of delay segments 138–146 is meant merely as illustrative and not to limit the present invention. The number of delay segments in the shift register 136 is based in part upon the acoustic environment being synthesized by the system.

As discussed above, the preprocessor 100 includes a plurality of early reflection taps 102*a*–102*d* associated with the delay segments 140–146. The illustrated embodiment includes four early reflection taps 102. This is meant merely to illustrate and not limit the present invention. Each early reflection tap 102 comprises a plurality of latch elements v equal to the number of output channels. In the present example, v equals 8. The positioning of the early reflection taps 102 is arbitrary, except that each of the early reflection taps 102 must uniquely associate with the data element set. Uniquely offsetting the latch elements of each of the early reflection taps 102 from the channels of the input signal DS adds desirable complexity to the reverberation characteristic. With regard to FIG. 3, the early reflection tap associated with delay segment 140 aligns with the data element set in the following manner. With both w and v being equal to 8, the first element of the early reflection tap 102*a* aligns with the third element of the data element set, the second element of the early reflection tap 102*a* aligns with the fourth element of the data element set and so on until the last element of the early reflection tap 102*a* aligns with the second element of the data element set. Each of the remaining early reflection taps 102 are uniquely associated with the data element set in a similar manner.

In order to prevent any contribution from the early reflection tap 102*d* associated with delay segment 146 from becoming part of the signal output from the preprocessor 100 additional delay segments may be added. In the example illustrated in FIG. 3, an additional delay segment 148 is connected to delay segment 146 for imparting an additional delay to add separation between the last early reflection tap 102*d* and the output of the preprocessor 100. The serial data element set output by the delay segment 148 may be input to a serial to parallel converter 150 to provide a parallel data element set.

The diffused field processor 200 serves to simulate the complex pattern of sound that is heard when source information bounces from surface to surface in a concert hall. In an actual acoustic environment, depending on the surface features of the room, the path taken by a sound from its source to the ear may be very long. Not only will a listener perceive the delay associated with such a long path, but the sound will have diminished in level due to absorption from surfaces it has encountered (hard surfaces are very reflective and soft surfaces are very absorbent), as well as through absorption by the air itself. The reverberation characteristic of a concert hall therefore becomes a function of the physical size and aspect ratio of the room, the number of reflecting surfaces and their positional relationship to one another, and the various material textures found in the room.

Figure 5:
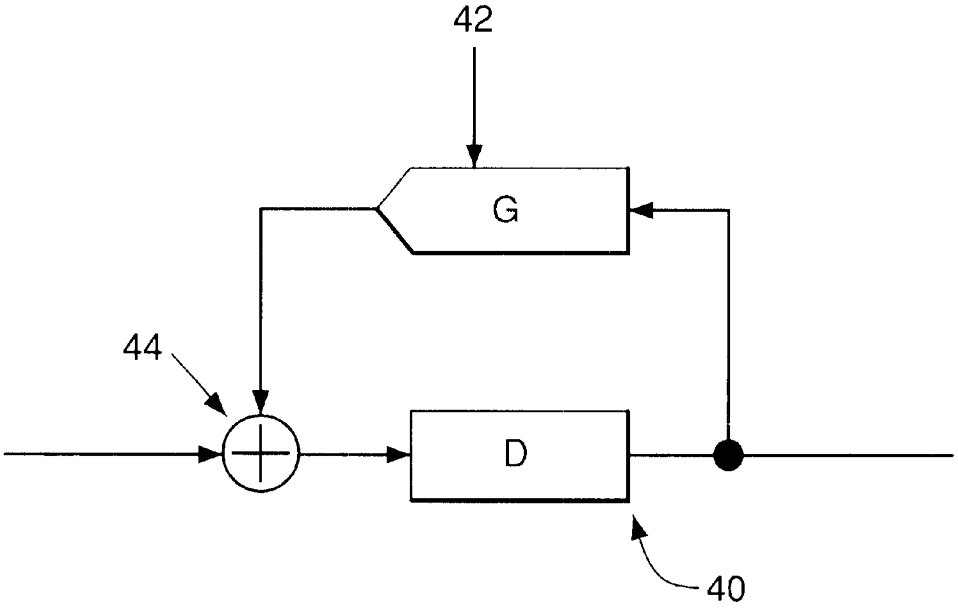
FIG. 5 is an example of a comb filter.
Figure 6:
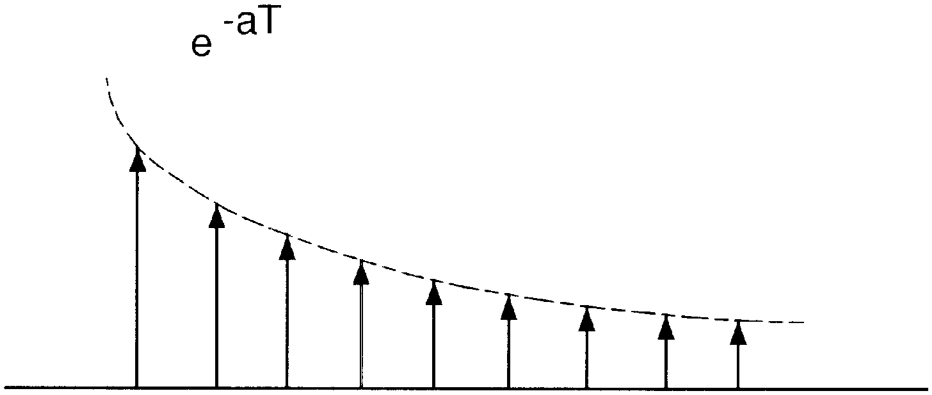
FIG. 6 is a plot illustrating the output versus time of the comb filter of FIG. 5 for an impulse input.

From a conceptual perspective, each of the paths from the sound source to the ear can be represented by a delay element whose output is fed back to the delay input through an attenuator. Sound injected into such a structure would recirculate, becoming fainter and fainter with each pass until the sound level became inaudible. Such a structure is illustrated schematically in FIG. 5. FIG. 5 illustrates a delay element 40 which provides a delay D, element 42 which provides an attenuation G, and an adder element 44 which combines the source sound signal and the feedback signal to close the loop. Such a structure is commonly known as a "comb filter." The output signal of such a comb filter is illustrated in FIG. 6. The graph represents the output of the filter versus time when the input of the filter is stimulated by an impulse response. As illustrated in FIG. 6, each vertical arrow denotes another pass through the loop of the comb filter and represents a corresponding echo. With each successive pass through the loop the magnitude of the signal diminishes due to the attenuator 42 until the sound becomes inaudible. This behavior can be expressed mathematically as $e^{-aT}$ where a is a function of delay D and attenuation G.

The comb filter, as illustrated in FIG. 5, has been the basis of various attempts to synthesize reverberation characteristics of large concert halls. A single comb filter, however, has been found to provide a less than adequate solution for such a complex task. The comb filter does possess drawbacks which must be taken into account in the design of a reverberation processor. Specifically, by its nature the comb filter is a frequency dependent element. Peaks and valleys in sound level resulting from audio information where period (1/f) is an even multiple of the delay produced by an element such as element 40 can be very objectionable. Another source of distortion commonly found has to do with summing two or more audio channels together. As with peaks and valleys produced by the comb filters, the act of adding signals together having the same frequency or close to the same frequency can cause cancellation, exaggerated loudness, or severe beating. In order to overcome the drawbacks of a single comb filter, multiple comb filters may be employed to produce more realistic results.

Figure 7:
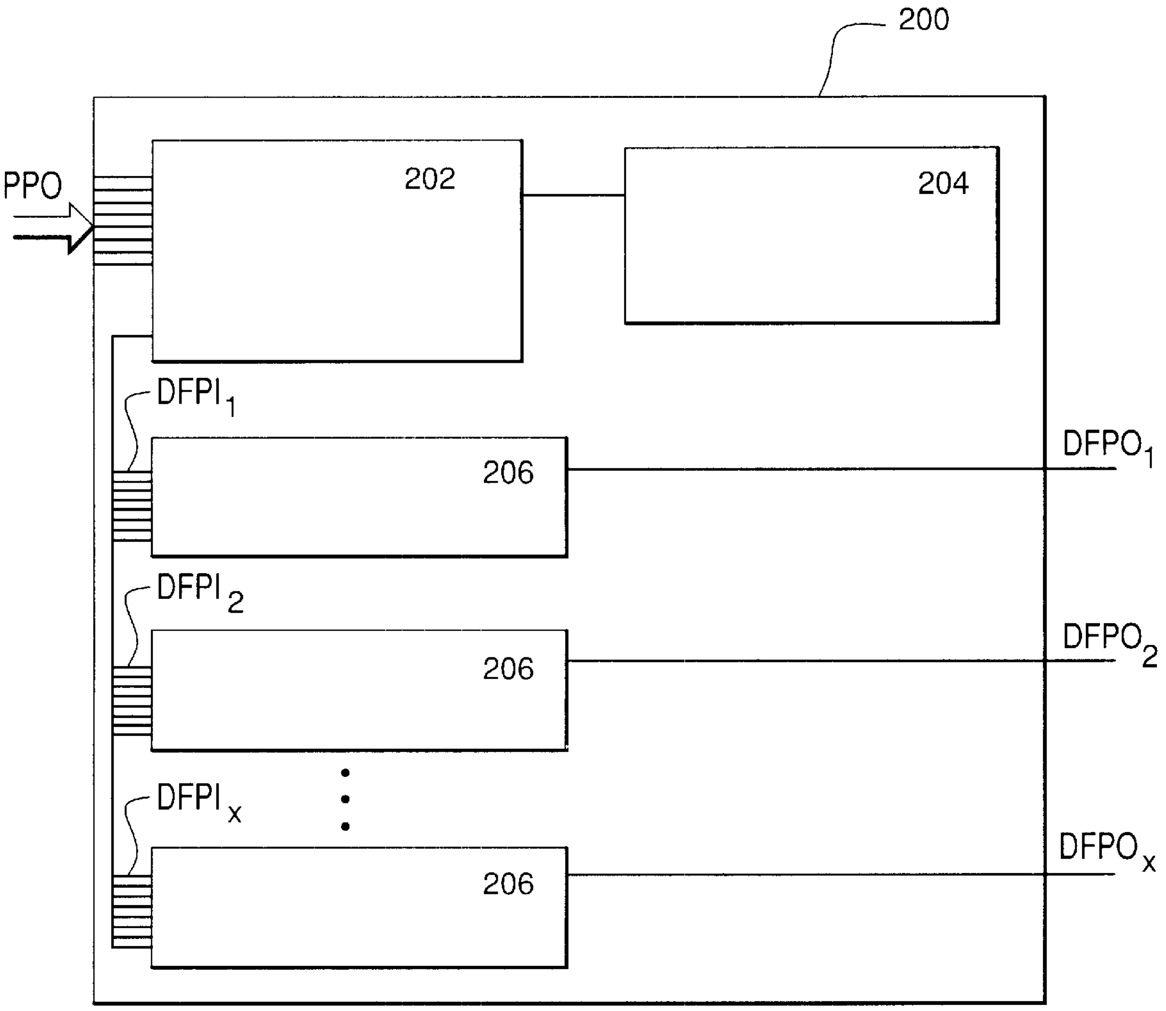
FIG. 7 is a block diagram illustrating the diffused field processor of FIG. 1.

The diffused field processor 200 illustrated in FIG. 7 receives the output signal PPO from the preprocessor 100. The signal PPO is received by a processor/generator 202. The diffused field processor 200 further includes a memory device 204 which may be, for example, a random access memory or other similar memory device. The diffused field processor 200 further includes a plurality of summing filters 206. Each of the plurality of summing filters 206 is connected to the processor/generator 202. Upon receipt of the preprocessor output signal PPO, the processor/generator 202 generates information for input to each of the plurality of summing filters 206. An example of the information generated by processor/generator 202 is illustrated in the table of FIG. 9.

Figure 8:
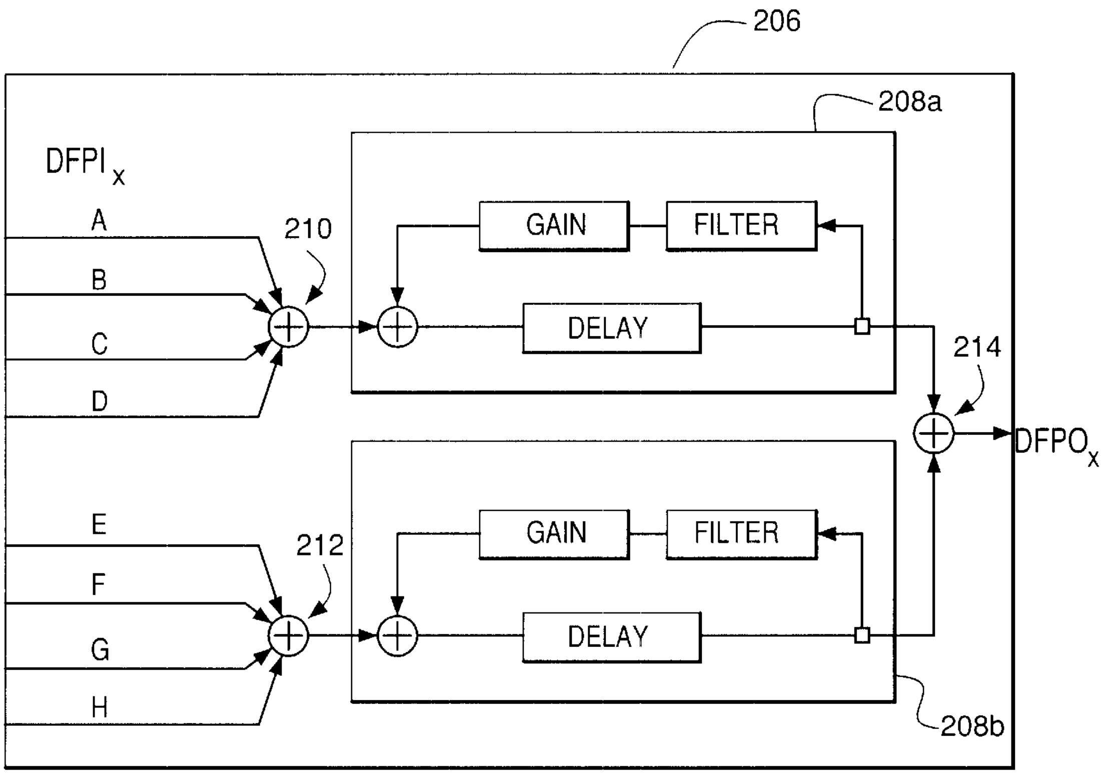
FIG. 8 is a block diagram illustrating a summing filter of FIG. 5.

When working with a variety of musical instruments playing similar or different musical themes, there is always the possibility that at any given moment in time (as represented by a set of data elements) two or more input signal data elements may have the same or similar frequency. In order to reduce the likelihood that these elements will cancel each other out (thereby reducing the reverberation effect), the present invention utilizes a summing filter 206 which includes a pair of comb filters 208. An example of the summing filter 206 is illustrated in FIG. 8. The summing filter 206 receives a unique combination of the data element set. In this example of the summing filter 206 the input of each comb filter 208 is the sum of w/2 channels where w represents the total number of input channels. As discussed above, in this example of the system the input signal DS comprises eight channels (i.e., w=8). Therefore, four channels will be summed together and input to each individual comb filter 208. Although each of the data elements are input to one or the other of the summing junctions 210, 212, the particular assignment of data elements to the summing junctions 210, 212 has a significant bearing on the quality of the reverberation effect. The number of unique combinations, of four channels taken from a total of eight channels when order is neglected is 70, as determined by the following equation.

$$\text{Combinations} = \frac{w!}{((w-p)!*p!)}$$

where w equals the total number of channels in the system and p equals the subset of channels being selected. In this case, w equals eight and p equals four.

The order in which channels are grouped is irrelevant because the sum of channels 1, 2, 3, and 4 produces the same result as the sum of channels 3, 2, 4, 1, for example. Since all channels must be represented in the input to each summing filter (DFPI) if one of the two groups is channels 1, 2, 3, and 4 then the other four channels by default would be the complementary channels 5, 6, 7, and 8. Using this combinational limitation there are only thirty-five unique combinations of eight channels taken four at a time, since the remaining thirty-five combinations are the complements. As stated above, FIG. 9 illustrates these thirty-five combinations and their complements. It can be seen that the channel constituents A–D for $DFPI_2$ are channels 5, 2, 3, and 4 while the complementary channel constituents E–H are channels 1, 6, 7, and 8. By grouping channels in this manner each diffused field processor output (DFPO) signal is a combination of all input signals, guaranteeing balanced levels between DFPIs. This balance occurs without direct summing of all of the signals. Even if any two input signals are in phase cancellation some DFPOs (those where the two signals are not in the same A–D or E–H subset) will produce non-zero signals. In contrast, the prior art systems sum all of the input signals before processing which may result in cancellation in the case of multiple phase correlated sources.

In addition, the combinations are such that any two adjacent rows differ in only one column for both the A–D and E–H sections and they differ in a symmetrical fashion. This allows the unique combinations of the table of FIG. 9 to be generated very quickly, and the summations in the summing filters to be performed very quickly. FIG. 10 illustrates this concept more clearly. Specifically, lines 15 and 16 have been isolated to show that column A and column G are the only columns that are not the same in these two rows, and that where the changes occur there is only a transposition of data elements from channels 1 and 2 in this particular case. Further, viewing rows 16 and 17, row 16 being repeated for clarity, channels 1 and 5 are now transposed in columns A and H. Finally, with lines 17 and 18 columns B and E, channels 7 and 8 are affected. Since this combination process occurs every sampling period, it is important to keep the system which generates the table of FIG. 9 as simple as possible.

Once the table of FIG. 9 has been recursively generated by the processor/generator 202, each unique combination, as indicated by $DFPI_x$ is input to an individual summing filter 206. As illustrated in FIG. 8, the elements found in columns A–D of a particular DFPI are input to comb filter 208*a* and the elements of columns E–H of the particular DFPI are input to comb filter 208*b*. In a hardware solution, the diffused field processor 200 will include as many summing filters 206 as is necessary to accommodate each of the DFPIs of table 9 which will be used by the system. In this example if all of the DFPIs of table 9 are utilized, then there will be thirty-five summing filters 206 necessary for this example. As discussed above, the possible number of DFPIs actually generated and used is a function of the number of channels in the input signal DS. The particular number of DFPIs which will be utilized, and the corresponding number of summing filters used, is discussed below.

The output of each of the comb filters 208*a*, 208*b* are summed by an adder 214 and output as a diffused field processor output (DFPO) signal. As illustrated in FIG. 7, each summing filter 206 provides a DFPO based upon the DFPI which has been input thereto. It is not, however, necessary to utilize all of the DFPIs that can be generated by the processor/generator 202. Fewer than all of the potential DFPIs may be sufficient to generate a set of DFPOs necessary for generating a realistic reverberation characteristic. The total number of DFPOs which must be generated is based upon the number of DFPOs which will be used to develop a diffused field component of the final output signal PRO generated by the post processor 300. The diffused field component will comprise subcomponents. Each subcomponent corresponds to an output channel or element of the output signal PRO. In this example, the number of output channels is equal to the number of input channels and therefore w and q are both equal to eight. In the example set forth, the number of DFPOs used per channel in the output signal is twelve. However, the higher the number of DFPOs per channel, the higher the degree of diffusion which can be achieved. The number of inputs used per channel to develop the output signal is selected based at least in part upon hardware and cost considerations. This is discussed further below and it should be noted that the number of DFPIs which are used is generally based upon the testing of the system in order to achieve a response which provides the most realistic reverberation characteristic to the input signal. The number of DFPIs used in this example is not intended to limit the scope of the present invention.

As an alternative to the hardware solution, a software solution may be implemented to generate the DFPOs. In such a solution, a single summing filter is used. As each unique combination of FIG. 9 is recursively generated it is input to the summing filter 206. In this solution, the summing filter 206 operates in the same manner as described above. Once the individual DFPO is generated, it is transferred to the post processor 300 for further processing.

Figure 11:
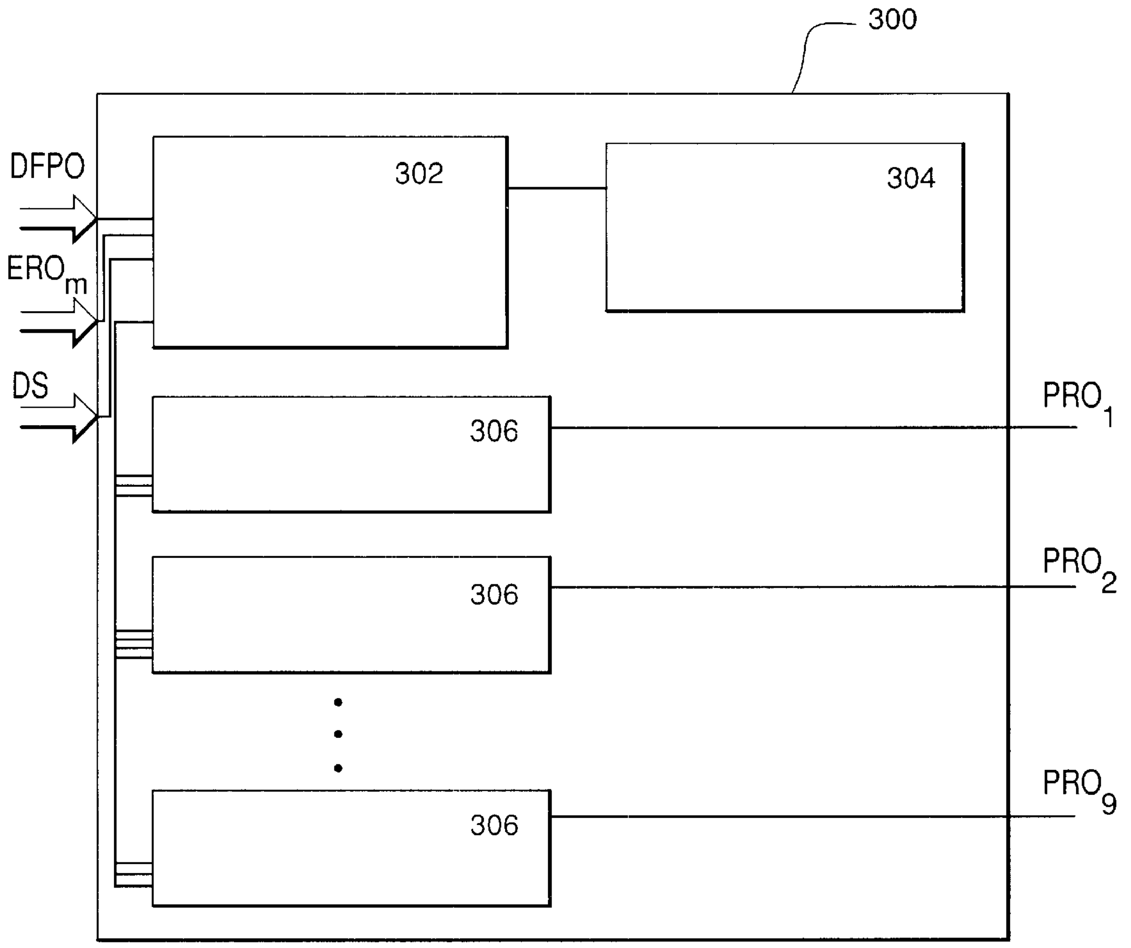
FIG. 11 is a block diagram illustrating the post processor of FIG. 1.
Figure 12:
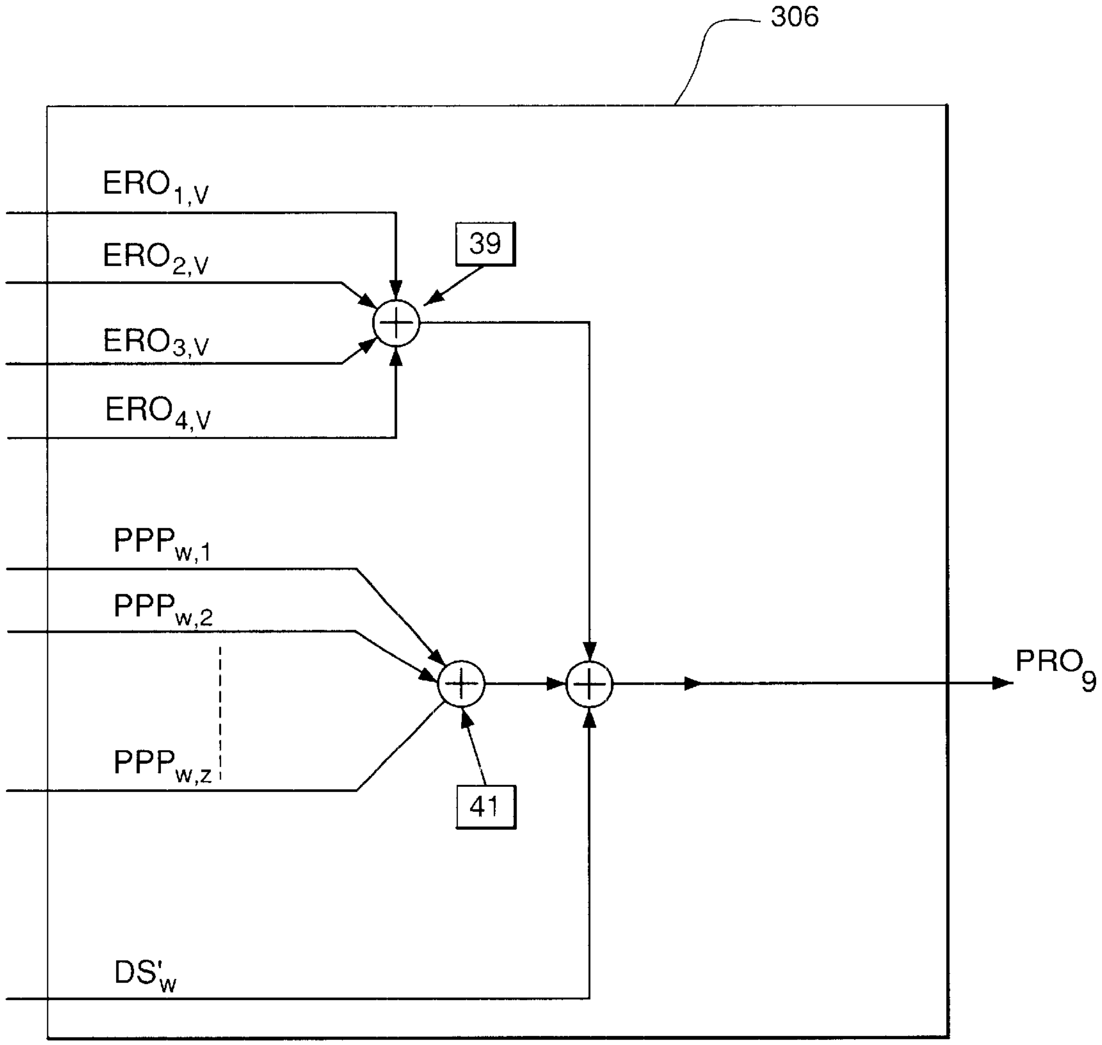
FIG. 12 is a block diagram illustrating an adder of FIG. 11.

The final stage of the system of the present invention is the post processor 300. The post processor 300 is illustrated in FIG. 11. As can be seen in FIG. 11, the post processor 300 receives the diffused field processor 200 output DFPO, the early reflection tap output $ERO_{m,v}$ and the original audio input signal DS. The post processor 300 includes a processor/combiner 302 which receives the various input signals. The post processor 300 also includes a plurality of adders 306. An example of an individual adder 306 is illustrated in FIG. 12. The processor/combiner 302 forwards the information from each input signal for a particular channel to the corresponding adder 306. The adder 306 produces a post processor output (PRO) which is representative of the output audio signal which has been imparted with a simulated reverberation. The post processor 300 will include as many adders 306 as there are output channels. In this example, the post processor 300 has eight adders 306, one for each output channel. The elements which make up the post processor output signal PRO are illustrated in FIG. 12. The first element is the processed input signal DS'. The original input signal DS is input to the input signal processor 50. In an embodiment where the number of input channels equals the number of output channels, as in this example, the input signal processor 50 is simply a unity device. Therefore in this example DS' equals DS. The DS' component imparts a sense of presence and directivity that focuses the listener toward the primary source of the sound.

The next component is the sum the latch location v of all of the early reflection taps 102 corresponding to the output channel q being constructed (v=q). The data element w that was input to the early reflection tap latch v and is the component of the output channel q is not necessarily the same location as the output channel q. In other words, the input data element w location does not necessarily correspond to the output element q location. For example, when the output of FIG. 12 is for audio output channel 3, q will equal 3 and therefore, v will also equal 3. In this example, as illustrated in FIG. 3, the data element corresponding to channel 5 (w=5) of the input signal DS is read into the third latch (v=3) of the first early reflection tap (m =1). $ERO_{2,3}$ (early reflection tap 2, location 3) is associated with the data element corresponding to channel 8 (w=8) of the input signal DS. $ERO_{3,3}$ (early reflection tap 3, location 3) is associated with the data element corresponding to channel 1 (w=1 of the input signal DS. Finally, $ERO_{4,3}$ (early reflection tap 4, location 3) is associated with the data element corresponding to channel 4 (w=4) of the input signal DS. In other words, location indications for taps do not necessarily correlate to the channel of the input signal DS. As indicated previously, channel misalignment adds desirable complexity to the reverberation characteristic.

The final component (PPP) of the output signal PRO imparts the feeling of spaciousness to the reverberation characteristic. The input elements $PPP_{1,z}$ are generated by the processor/combiner 302 from the outputs (DFPO) of the diffused field processor 200. The processor/combiner 302 uses a predetermined summing scheme to combine various DFPOs. The DFPO signals are selectively combined in a manner to achieve the lowest correlation between output channels. The lower the correlation between output channels, the more spacious and natural effect to the reverberation characteristic.

In this example, the summing scheme is determined with the knowledge that there are eight input channels and there are eight output channels. The processor/combiner 302 selectively combines various DFPOs to generate a post processor input set, wherein the post processor input set comprises eight elements, one for each output channel. Each element is a combination of DFPOs according to the predetermined summing scheme. The predetermined summing scheme (an example being at the top of FIG. 13) is developed to achieve the lowest correlation between output channels in order to provide a more spacious and natural effect. The greater the number of DFPOs that can be incorporated into the scheme the better, as higher numbers tend to eliminate high resonance and increase the density of the generated field.

The summing scheme is determined in the following manner. The relationship between the number of output channels and the number of input channels is determined. In this case the number of output channels equals the number of input channels. Then the number of DFPOs which will be combined to generate the PPO component of the output signal PRO is determined. Then the overall number of DPFOs which will be generated in the diffused field processor 200 from the DFPIs is selected. Once the number of DFPOs which are to be generated is determined, it must be determined how to build a unique subset of the DFPOs for each output channel.

In the example wherein eight channels are present in the audio input signal, the inventor determined that twelve DFPOs should be combined in the same output channel. Once the inventor determined that twelve DFPOs should be combined in the summing scheme for each output channel the inventor determined that twenty-seven (out of 35 available) DFPOs should be generated. The inventor then determined that four out of every seven generated DFPOs should be combined to achieve a satisfactory result. Since it was already determined that twelve DFPOs was a good number for the summing scheme, three sets of seven DFPOs, where four of the seven are used, would be necessary to achieve the twelve DFPOs for the summing scheme. Therefore, the scheme would have twenty-one total elements wherein twelve of the elements are combined (either added or subtracted to the total) using twenty-seven DFPOs to generate eight channels. The eight channels form an output set having eight elements (each channel corresponding to an element). Each of the eight elements is combined with the corresponding tap component and the audio input signal elements $DS'_w$ in each of the adders 306. An example of a predetermined summing scheme is illustrated at the top of FIG. 13. In this summing scheme a plus sign (+) signifies the addition of the DFPO to the output set element, a negative sign (–) signifies subtraction or negative addition and "s" signifies DFPOs which are not included in the summation. FIG. 13 illustrates a table which would be generated for the summation scheme. The table has twenty-one columns representing the total number of elements of the summation scheme (as discussed above) and eight rows corresponding to the number of output channels in the system used to illustrate the present invention. As stated above, each row or channel corresponds to an element of the output set. The table is filled by using the DFPOs generated in the diffused field processor 200. The table is completed by placing $DFPO_1$ in column 1, row 1 and continuing to the right with the next DFPO and so on. When column 21 is reached the process continues in the first column of the next row down. Each time the insertion of DFPOs reaches $DFPO_{27}$ (the total number of DFPOs generated in this example), the insertion begins again with $DFPO_1$. FIG. 14 illustrates a refinement of the table of FIG. 13. In FIG. 14, only those DFPOs which will contribute to the output set are shown wherein the DFPOs to be added are shown in black on white and the DFPOs to be subtracted are shown in white on black. As discussed above, the table of FIG. 14 provides twelve columns corresponding to the twelve elements of the summation scheme to be combined for each channel for the output set.

A selection of how many DFPOs should be combined in the summing scheme, how many DFPOs should be generated in the diffused field processor 200 and the manner in which the summing scheme is developed is based upon hardware restraints and considerations, cost/benefit analysis, and design experimentation which are all used in combination with voicing experiments to achieve a satisfactory reverberation characteristic. The particular value selected and described above merely present an example of implementing the present invention and are not intended to limit the scope thereof.

EXAMPLE 2

In another example, the number of output channels q is less than the number of input channels w. In this embodiment, there are six input channels and four output channels. Accordingly, each of the early reflection taps 102*a*–102*d* has four latches and aligns with an unique linear combination of four of the six data elements of the input signal DS. In this embodiment, the input signal DS is processed by the input signal processor 50 prior to being input to the post processor 300. The input signal processor 50 selectively combines the audio input signal channel data elements and outputs a signal DS' having a plurality of channels equal to the audio output signal PRO. In this example that number equals four. Just as in the situation where the number of output channels equals the number of input channels, determining the number of DFPIs to generate, the number of DFPOs generated and the summing scheme is based upon the number of output channels. These variables are determined with an eye (and an ear) towards creating the most realistic reverberation signal within the economic and hardware constraints placed on the inventor. All other aspects of the present invention as discussed above with respect to the example wherein the number of output channels equals the number of input channels are applicable to this example, having the number of output channels not equal to the number of input channels.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for generating a simulated reverberation signal having a plurality of output channels, comprising the steps of:

receiving an audio input signal having a plurality of input channels, each input channel containing time-synchronized data elements, the corresponding time-synchronized data elements of the plurality of input channels forming a set of data elements;

imparting a unique delay to each data element of the set of data elements;

repeatedly delaying the set of data elements;

associating a plurality of taps with the repeatedly delayed set of data elements, each tap having a plurality of latch elements equal to the plurality of output channels;

coupling the latch elements of each tap to a distinct linear combination of the repeatedly delayed data elements;

reading into and outputting from each tap a tap output set comprising the distinct linear combination of the data elements;

inputting to each one of a plurality of summing filters a uniquely ordered combination of the repeatedly delayed set of data elements, each uniquely ordered combination comprising a plurality of complementary subsets;

within each summing filter inputting each one of the plurality of complementary subsets into one of a plurality of individual filters;

for each of the plurality of summing filter, combining the output of the individual filters and outputting this combination, each summing filter output being an element of a summing filter output set;

generating the simulated reverberation signal, each of the output channels comprising a summation of a predetermined combination of the summing filter output set elements, the tap output set element of each of the plurality of taps which corresponds to the output channel, and a preselected combination of the time-synchronized data elements of the audio input signal.

2. A method as claimed in claim 1, wherein the input audio signal channels are parallel thereby providing parallel data elements.

3. A method as claimed in claim 2, further comprising the step of converting the uniquely delayed parallel data elements to a set of serial elements.

4. A method as claimed in claim 3, further comprising the step of converting the repeatedly delayed set of serial data elements to a set of parallel data elements.

5. A method as claimed in claim 1, wherein the predetermined combination of the summing filter output set elements is selected to achieve a high degree of diffusion in the reverberation signal.

6. A method for generating a simulated reverberation signal having a plurality of output channels, comprising the steps of:

receiving an audio input signal comprising a set of data elements;

repeatedly delaying the set of data elements;

associating a plurality of taps with the repeatedly delayed set of data elements, each tap having a plurality of latch elements equal to the plurality of output channels;

coupling the latch elements of each tap to a distinct linear combination of the repeatedly delayed data elements;

reading into and outputting from each tap a tap output set comprising the distinct linear combination of the data elements;

inputting to each one of a plurality of summing filters a uniquely ordered combination of the repeatedly delayed set of data elements, each uniquely ordered combination comprising a plurality of complementary subsets;

within each summing filter inputting each one of the plurality of complementary subsets into one of a plurality of individual filters;

for each of the plurality of summing filters, combining the outputs of the individual filters and outputting this combination, each summing filter output being an element of a summing filter output set;

selectively combining the summing filter output set elements into a sum set having a number of elements equal to the plurality of output channels and then combining each sum set element with a corresponding element of the tap output set of each of the plurality of taps and a preselected combination of the audio input signal data element set.

7. A method as claimed in claim 6, wherein each input audio signal data element is imparted with a unique delay.

8. A method for generating a simulated reverberation signal having a plurality of output channels, comprising the steps of:

receiving an audio input signal having a plurality of input channels, each input channel containing time-synchronized data elements, the time-synchronized data elements of the plurality of input channels forming a set of data elements;

imparting a unique delay to each data element of the set of data elements;

repeatedly delaying the set of data elements;

inputting to each one of a plurality of summing filters a uniquely ordered combination of the repeatedly delayed set of data elements, each uniquely ordered combination comprising a plurality of complementary subsets;

within each summing filter inputting each one of the plurality of complementary subsets into one of a plurality of individual filters;

for each of the plurality of summing filter, combining the output of the individual filters and outputting this combination, each summing filter output being an element of a summing filter output set;

generating the simulated reverberation signal, each of the output channels comprising a summation of a predetermined combination of the summing filter output set elements and a preselected combination of the time-synchronized data elements of the audio input signal.

9. A method as claimed in claim 8, further comprising the steps of:

associating a plurality of taps with the repeatedly delayed set of data elements, each tap having a plurality of latch elements equal to the plurality of output channels;

coupling the latch elements of each tap to a distinct linear combination of the repeatedly delayed data elements;

reading into and outputting from each tap a tap output set comprising the distinct linear combination of the data elements; and summing the tap output set element of each of the plurality of taps which corresponds to the output channel into the output channel summation.

10. A method for generating a simulated reverberation signal having a plurality of output channels, comprising the steps of:

receiving an audio input signal comprising a plurality of input channels, the plurality of input channels continuously transmitting time-synchronized data element sets;

for each data element set, imparting a unique delay to each data element;

repeatedly delaying the data element set;

associating a plurality of taps with the repeatedly delayed data element set, each tap having a plurality of latch elements equal to the plurality of output channels;

coupling the latch elements of each tap to a distinct linear combination of the repeatedly delayed data elements;

reading the distinct linear combination of the repeatedly delayed data elements into each tap and outputting the distinct linear combination of the repeatedly delayed data elements from each tap as a tap set;

recursively generating a uniquely ordered combination of the repeatedly delayed data element set, each uniquely ordered combination comprising a plurality of complementary subsets;

for each uniquely ordered combination of the repeatedly delayed data element set, inputting each one of the plurality of complementary subsets thereof into one of a plurality of individual filters and combining outputs of each of the plurality of individual filters corresponding to the uniquely ordered combination of the repeatedly delayed data element set, thereby generating an adder sum set;

selectively combining individual adder sum set elements to produce an adder output sum set having a number of elements equal to the plurality of output channels;

combining corresponding elements of the plurality of tap sets to produce tap output sum sets having a number of elements equal to the plurality of output channels;

combining corresponding elements of the adder output sum set and the tap output sum set and a preselected combination of the time-synchronized data element set to produce an output data element set having a reverberation effect introduced therein.

11. A method as claimed in claim 10, wherein the individual adder sum set elements are combined to achieve a low degree of correlation and a high degree of diffusion between the plurality of channels of the audio input signal.

12. A method as claimed in claim 11, wherein the uniquely ordered combination of the delayed synchronized data element set is generated a number of times to achieve a low degree of correlation and a high degree of diffusion between the plurality of output channels.

13. A method as claimed in claim 10, wherein the uniquely ordered combination of the delayed synchronized data element set is generated by transposing a different two of the data elements each time another combination is generated.

14. A method as claimed in claim 10, wherein four taps are associated with the delayed synchronized data element set.

15. A method as claimed in claim 10, wherein twenty seven uniquely ordered combinations of the delayed synchronized data element set are generated.

16. A method as claimed in claim 10, wherein the individual filters are comb filters.

17. A system for generating a simulated reverberation signal having a plurality of output channels comprising:

a preprocessor stage which receives an audio input signal comprising a set of time-synchronized data elements, the preprocessor stage comprising:

a delay component for imparting a unique delay to each element of the time-synchronized data element set;

a series of memory elements connected to the delay component, a first memory element receiving the set of uniquely delayed time-synchronized data elements and each of the plurality of memory elements imparting a delay to the set of uniquely delayed time-synchronized data elements; and a plurality of taps, each tap having a plurality of latch elements equal to the number of output channels, each tap coupled to the series of memory elements at a unique delay wherein the plurality of latch elements of each tap align with a unique linear combination of time-synchronized data elements and each tap reads in the unique linear combination of the synchronized data elements and outputs a tap data set;

a diffused field processor stage which receives the delayed set of uniquely delayed time-synchronized data elements, the processor stage comprising:

a first processor for receiving the delayed set of uniquely delayed time-synchronized data elements and generating a set of combinations of the delayed set of uniquely delayed time-synchronized data elements, each element of the combinations set comprising a uniquely ordered combination of the set of uniquely delayed time-synchronized data elements;

a memory for receiving and storing the combinations set; and a plurality of summing filters connected to the first processor, each of the plurality of summing filters comprising a plurality of filters, wherein the output of the plurality of filters of each summing filter are summed and output from the summing filter; and wherein the first processor transfers to each of the plurality of summing filters a distinct one of the elements of the combinations set such that each one of a plurality of complementary subsets of the uniquely ordered combination is input to each of the plurality of filters and the output of each summing filter is output from the diffused field processor stage; and a post processor stage which receives the output of each summing filter, the set of time-synchronized data elements and the tap data set of each tap, the post processor stage comprising:

a second processor for receiving the output of each summing filter, the set of time-synchronized data elements and the tap data set of each tap and selectively combining the outputs of the summing filters into a sum output set, the sum output set having a number of elements equal to number of output channels; and a plurality of adders connected to the second processor, each of the adders receiving from the second processor a distinct element of the sum output set, a corresponding element of the tap data set of each tap, and preselected combination of the time-synchronized data elements, wherein each adder adds the received elements and provides an output for each of the plurality of output channels.

18. A system as claimed in claim 17, wherein the outputs of the summing filters are combined to achieve a low degree of correlation and a high degree of diffusion between the synchronized data elements.

19. A system as claimed in claim 18, wherein the combinations set comprises a number of elements to achieve a low degree of correlation and a high degree of diffusion between the synchronized data elements.

20. A system as claimed in claim 17, wherein the uniquely ordered combinations of the combinations set are generated by transposing a different two of the delayed synchronized data elements for each uniquely ordered combination.

21. A system as claimed in claim 17, wherein the preprocessor stage comprises four taps.

22. A system as claimed in claim 17, wherein the first processor generates twenty seven uniquely ordered combinations of the set of uniquely delayed synchronized data elements.

23. A system as claimed in claim 17, wherein twelve summing filter outputs are selectively combined.

24. A system as claimed in claim 17, wherein the filters are comb filters.

25. A system for generating a simulated reverberation signal having a plurality of output channels comprising:

a preprocessor stage which receives an audio input signal comprising a set of time-synchronized data elements, the preprocessor stage comprising:

a series of memory elements connected to the delay component, a first memory element receiving the set of uniquely delayed time-synchronized data elements and each of the plurality of memory elements imparting a delay to the set of uniquely delayed time-synchronized data elements; and a plurality of taps, each tap having a plurality of latch elements equal to the number of output channels, each tap coupled to the series of memory elements at a unique delay wherein the plurality of latch elements of each tap align with a unique linear combination of time-synchronized data elements and each tap reads in the unique linear combination of the synchronized data elements and outputs a tap data set;

a diffused field processor stage which receives the delayed set of uniquely delayed time-synchronized data elements, the processor stage comprising:

a first processor for receiving the delayed set of uniquely delayed time-synchronized data elements and generating a set of combinations of the delayed set of uniquely delayed time-synchronized data elements, each element of the combinations set comprising a uniquely ordered combination of the set of uniquely delayed time-synchronized data elements;

a memory for receiving and storing the combinations set; and a plurality of summing filters connected to the first processor, each of the plurality of summing filters comprising a plurality of filters, wherein the output of the plurality of filters of each summing filter are summed and output from the summing filter; and wherein the first processor transfers to each of the plurality of summing filters a distinct one of the elements of the combinations set such that each one of a plurality of complementary subsets of the uniquely ordered combination is input to each of the plurality of filters and the output of each summing filter is output from the diffused field processor stage; and a post processor stage which receives the output of each summing filter, the set of time-synchronized data elements and the tap data set of each tap, the post processor stage comprising:

a second processor for receiving the output of each summing filter, the set of time-synchronized data elements and the tap data set of each tap and selectively combining the outputs of the summing filters into a sum output set, the sum output set having a number of elements equal to number of output channels; and a plurality of adders connected to the second processor, each of the adders receiving from the second processor a distinct element of the sum output set, a corresponding element of the tap data set of each tap, and preselected combination of the time-synchronized data elements, wherein each adder adds the received elements and provides an output for each of the plurality of output channels.

26. A system as claimed in claim 25, further comprising a delay component for imparting a unique delay to each element of the time-synchronized data element set.

27. A system for generating a simulated reverberation signal having a plurality of output channels comprising:

a preprocessor stage which receives an audio signal comprising a set of time-synchronized data elements, the preprocessor stage comprising:

a delay component for imparting a unique delay to each element of the time-synchronized data element set;

a series of memory elements connected to the delay component, a first memory element receiving the set of uniquely delayed time-synchronized data elements and each of the plurality of memory elements imparting a delay to the set of uniquely delayed time-synchronized data elements; and a diffused field processor stage which receives the delayed set of uniquely delayed time-synchronized data elements, the processor stage comprising:

a first processor for receiving the delayed set of uniquely delayed time-synchronized data elements and generating a set of combinations of the delayed set of uniquely delayed time-synchronized data elements, each element of the combinations set comprising a uniquely ordered combination of the set of uniquely delayed time-synchronized data elements;

a memory for receiving and storing the combinations set; and a plurality of summing filters connected to the first processor, each of the plurality of summing filters comprising a plurality of filters, wherein the output of the plurality of filters of each summing filter are summed and output from the summing filter; and wherein the first processor transfers to each of the plurality of summing filters a distinct one of the elements of the combinations set such that each one of a plurality of complementary subsets of the uniquely ordered combination is input to each of the plurality of filters and the output of each summing filter is output from the diffused field processor stage; and a post processor stage which receives the output of each summing filter and the set of time-synchronized data elements, the post processor stage comprising:

a second processor for receiving the output of each summing filter and the set of time-synchronized data elements and selectively combining the outputs of the summing filters into a sum output set, the sum output set having a number of elements equal to number of output channels; and a plurality of adders connected to the second processor, each of the adders receiving from the second processor a distinct element of the sum output set and preselected combination of the time-synchronized data elements, each adder adding the received elements and providing an output for each of the plurality of output channels.

28. A system as claimed in claim 27, further comprising a plurality of taps, each tap having a plurality of latch elements equal to the number of output channels, each tap coupled to the series of memory elements at a unique delay wherein the plurality of latch elements of each tap align with a unique linear combination of time-synchronized data elements and each tap reads in the unique linear combination of the synchronized data elements and outputs a tap data set, wherein the tap data set for each tap is input to the post processor stage and therein into the second processor, the second processor inputs an element of the tap data set of each tap corresponding to a particular output channel to the corresponding adder.

* * * * *